United States Patent [19]
Itai et al.

[11] Patent Number: 5,838,069
[45] Date of Patent: Nov. 17, 1998

[54] CERAMIC SUBSTRATE HAVING PADS TO BE ATTACHED TO TERMINAL MEMBERS WITH PB-SN SOLDER AND METHOD OF PRODUCING THE SAME

[75] Inventors: Motohiko Itai, Gifu; Hiroyuki Hashimoto; Kazuo Kimura, both of Aichi, all of Japan

[73] Assignee: NGK Spark Plug Co., Ltd., Nagoya, Japan

[21] Appl. No.: 827,314

[22] Filed: Mar. 26, 1997

[30] Foreign Application Priority Data

Apr. 11, 1996 [JP] Japan ................................ 8-114283

[51] Int. Cl.⁶ .......................... H01L 23/48; H01L 23/52
[52] U.S. Cl. ................... 257/766; 257/703; 257/772; 257/779; 257/781; 438/612; 438/650; 438/686
[58] Field of Search .................... 257/766, 772, 257/779, 781, 703; 438/612, 650, 686

[56] References Cited

U.S. PATENT DOCUMENTS

| | | | |
|---|---|---|---|
| 5,134,461 | 7/1992 | Yamakawa et al. | 357/71 |
| 5,190,601 | 3/1993 | Yamakawa et al. | 148/518 |
| 5,345,038 | 9/1994 | Miyauchi et al. | 174/52.4 |
| 5,482,735 | 1/1996 | Miyauchi et al. | 427/58 |
| 5,483,105 | 1/1996 | Kaja et al. | 257/779 |
| 5,583,379 | 12/1996 | Sato et al. | 257/766 |
| 5,635,764 | 6/1997 | Fujikawa et al. | 257/779 |

FOREIGN PATENT DOCUMENTS

| | | |
|---|---|---|
| 58-38505 | 8/1983 | Japan . |
| 59-4062 | 1/1984 | Japan . |
| 59-6365 | 1/1984 | Japan . |
| 59-36948 | 2/1984 | Japan . |
| 59-114846 | 7/1984 | Japan . |
| 60-21229 | 5/1985 | Japan . |
| 2-175195 | 7/1990 | Japan . |
| 2-240995 | 9/1990 | Japan . |
| 3-13558 | 1/1991 | Japan . |
| 3-179793 | 8/1991 | Japan . |
| 7-62273 | 7/1995 | Japan . |

*Primary Examiner*—David Ostrowski
*Attorney, Agent, or Firm*—Foley & Lardner

[57] ABSTRACT

A ceramic substrate having on the surface thereof a plurality of pads to be attached to terminal members is provided. Each pad includes a metallic layer formed on the surface of the substrate and a connecting layer made of a nickel base alloy and formed on the metallic layer. A gold-nickel layer made of a gold base alloy containing nickel is formed on the connecting layer. The gold-nickel layer may be formed by first forming a gold layer on the connecting layer and then making nickel in the connecting layer to diffuse into the gold layer by heat treatment. A method of producing such a ceramic substrate is also provided.

13 Claims, 7 Drawing Sheets

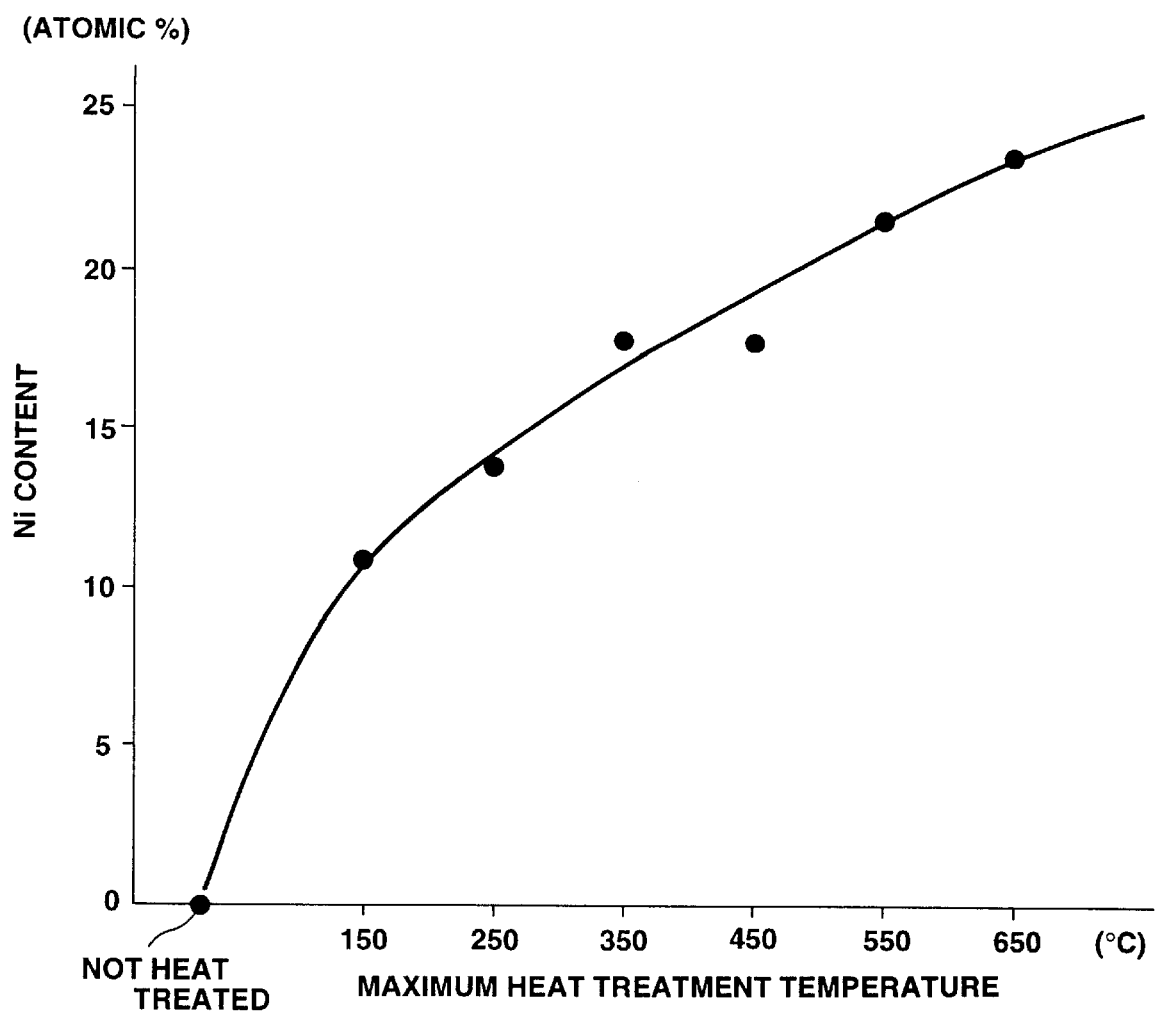

CERAMIC SUBSTRATE HAVING PADS TO BE ATTACHED TO TERMINAL MEMBERS WITH PB-SN SOLDER AND METHOD OF PRODUCING THE SAME

BACKGROUND OF THE INVENTION

1. Field of the Invention

The present invention relates to a ceramic substrate having pads to be attached to terminal members with Pb-Sn solder. More specifically, the present invention relates to a ceramic substrate having pads which are arranged so as to form a grid or checkered pattern and used for arranging terminals on the surface thereof, for connection to IC chips, substrates of motherboards, etc. Further, the present invention relates to a method of producing a substrate having such pads.

2. Description of the Related Art

Due to recent development of an integrated circuit (IC) technology, the number of input/output terminals provided to an IC chip is increasing. However, in the case the input/output terminals are arranged at the peripheral portion of the IC chip, the size of the IC chip is inevitably increased with increase in the number of the terminals, thus making higher the cost of the chip and its package substrate and making lower the yielding rate thereof.

Thus, it has been practiced to arrange such terminals on the main surface (plane surface) of the chip in such a manner as to form a grid or checkered pattern while forming pads at the corresponding positions on the substrate, for thereby joining the terminals and the pads all at once, i.e., it has been practiced to employ a so-called flip-chip method. Further, also in the case the substrate having installed thereon an IC chip, etc. is connected to a printed circuit board (PCB) such as a motherboard, it has been practiced to provide the surface of the IC installed substrate and the corresponding surface of the motherboard substrate with pads in such a manner that the pads form a grid pattern, respectively, then provide the pads of either of the IC installed substrate or the motherboard substrate with nearly spherical terminal members made of high temperature solder or Cu by soldering, previously, and thereafter join the IC installed substrate and the motherboard substrate together by soldering by way of the terminal members. Generally, a substrate having only pads which are arranged in a way as to form a grid pattern is called a land grid array (LGA) and a substrate having pads and terminal members (connecting terminals) in the form of ball and placed on the respective pads is called a ball grid array (BGA).

In the meantime, in the case the pads and terminal members are formed on the surface of the chip and substrates in a way as to form a grid pattern (including a checkered pattern) in the above described manner in order to connect the IC chip to the substrate and then the substrate to the motherboard substrate (hereinafter, this kind of connection will be referred to as a grid-patterned surface connection), a difference in thermal expansion is caused in the direction of the plane surface of the substrate due to the difference in coefficient of thermal expansion resulting from the difference in material between the IC chip and the substrate and between the substrate and the motherboard substrate (hereinafter referred to as substrate and the like). That is, when observation is made from the side of the terminal members, the substrate and the like to which the terminal members are connected tend to deform in the opposite directions parallel to the plane surface thereof, respectively, thus causing a shearing force to act upon the terminal members.

This shearing force becomes maximum between two pads or terminals which are most distant from each other among the pads or terminals which are joined with grid-patterned surface connection. That is, in the case the terminals for instance are constructed and arranged so as to form a grid pattern and the outermost ones thereof are formed so as to constitute a square shape, two of the terminals which are located on each diagonal are most influenced by the thermal expansion difference between the substrate and the like and thus subjected to the largest shearing force. Particularly, in the case a substrate such as LGA or BGA is connected to a motherboard substrate, the distance (pitch) between the adjacent pads or terminals is relatively large, and therefore the distance between remotest two of the pads or terminals is prone to become large. Particularly, in the case a substrate made of ceramic is used as a LGA or BGA substrate, it differs largely in the coefficient of thermal expansion from a motherboard substrate which is generally a substrate made of glass epoxy, so the resulting shearing force becomes large.

When such a large shearing force is applied to the substrate and the like, the joint portion between them may be broken or fractured in case the adhesive strength (joining strength) in adherence of the pads to the terminals is not so large, i.e., the terminals may be separated from the pads, so it is desired to make the adhesive strength sufficiently large.

In the meantime, generally used as a pad to be formed on a ceramic substrate is such one that is obtained by forming on the substrate a metallic layer made of a high melting point metal such as tungsten, molybdenum or the like by firing simultaneous with or later than that for the substrate of itself and then nickel(Ni)-plating the metallic layer. This nickel-plated layer is provided for the purpose of making the high melting point metal which cannot be wetted by solder, be capable of being soldered and serves as a connecting layer connecting between the high melting point metal and the solder. Further, in many cases, the surface of the pad is gold (Au)-plated. This is for the purpose of preventing oxidation of the nickel-plated layer and obtaining a stable solderability.

However, by a shearing test which was conducted by soldering a spherical terminal member to such an above described pad with Pb-Sn eutectic solder and pushing the terminal member in the direction parallel to the surface of the substrate (or the surface of the pad) until the connection between the terminal member and the pad was broken or fractured, it was revealed from the resulting mode of breakage or fracture that breakage or fracture was caused in such a manner as to allow the nickel-plated connecting layer and the Pb-Sn eutectic solder to separate or peel off from each other at the interface therebetween. It is considered that such separation or peeling was caused for the following reason. Gold (Au) in the gold-plated layer will dissolve quite easily and readily into the solder and diffuse thereinto, that is, eating or consumption of gold by solder occurs. Thus, the solder is made to contact directly with the nickel-plated layer. However, since the wetting of the solder relative to the nickel-plated connecting layer is not sufficient, the joining or connection between the nickel-plated layer and the solder is broken or fractured in such a manner as to allow the nickel-plated layer and the solder to be separated at the interface therebetween when the terminal member is subjected to a shearing force, or gold (Au) reacts with tin (Sn) in the solder to form brittle intermetallic compounds with tin. That is, this indicates that the adhesive strength in adherence of the connecting layer formed by nickel-plating to the solder layer against the shearing stress is not sufficient.

Further, in the case the adhesion is insufficient in the above manner, a low durability may possibly result in joining of a substrate and a motherboard substrate. To confirm this, both of the substrate and the motherboard substrate were subjected to a temperature cycle test and it was found as expected that the joining or connection of the both was fractured in such a manner as to allow them to separate at the interface therebetween at a few cycles, i.e., at a relatively short period of time and therefore the both did not have a sufficient durability.

In the meantime, in Japanese patent provisional publication No. 8-31974, it is disclosed that a pad formed on a substrate is provided with a recess so that a terminal in the form of a ball can be joined to the pad accurately and firmly in place.

However, such an invention requires each pad to be treated by a grinding process and each pad to be formed with a recess by applying a smaller amount of metallic paste to a central portion of each pad and a larger amount of metallic paste to an outer peripheral portion of each pad, thus causing a difficulty in manufacture and increasing the cost.

SUMMARY OF THE INVENTION

In accordance with the present invention, there is provided a novel and improved ceramic substrate which has on a surface thereof a pad to be attached to a terminal member with Pb-Sn solder, wherein the pad includes a metallic layer formed on the surface of the substrate and a connecting layer formed on the metallic layer and made of a nickel base alloy, and wherein a gold-nickel layer made of a gold base alloy containing nickel and of the thickness in the range of 0.01 $\mu$m to 0.5 $\mu$m is formed directly on the connecting layer. Since the gold-nickel layer made of a gold base alloy containing nickel is formed on the connecting layer made of a nickel base alloy, it never occurs that as in the case the gold layer is formed simply by electroplating or the like the gold in the gold layer is dissolved into the Pb-Sn solder, i.e., eaten or consumed by solder and diffused into the same, to make the Pb-Sn solder and the connecting layer made of nickel contact directly with each other and be soldered. This is due to the fact that nickel in the gold-nickel layer prevents gold from being eaten or consumed by the solder and diffused into the same. Further, this prevents formation of brittle Au-Sn intermetallic compounds. Accordingly, when a terminal member is attached to such a ceramic substrate by Pb-Sn solder, breakage or fracture never occurs in such a manner as to cause separation or peeling at the interface between the connecting layer made of nickel and the solder but it becomes possible for the terminal member to be firmly soldered to the pad.

In this connection, it is preferable that the thickness of the gold-nickel layer is in the range of 0.01 $\mu$m to 0.5 m. If the gold-nickel layer is extremely thin, it is impossible to make higher the adhesive strength, and it is impossible to prevent oxidation of the connecting layer. On the other hand, if too thick, the solder of itself becomes brittle due to intermetallic compounds formed by gold and tin, so it is not desirable to use a too much amount of gold.

Further, it is preferable that the nickel content of the nickel-gold layer is equal to or larger than 10 atomic %. When the nickel content is equal to or higher than 10 atomic %, nickel becomes more effective in preventing the gold in the gold-nickel layer from being eaten or consumed by the solder and diffused into the same, so there never occurs such breakage or fracture that causes the connecting layer of nickel and the solder to separate at the interface therebetween.

According to a further aspect of the present invention, there is provided a ceramic substrate having a pad on a surface thereof and a terminal member attached to the pad with Pb-Sn solder, wherein the pad includes a metallic layer formed on the surface of the substrate and a connecting layer made of a nickel base alloy and formed on the metallic layer, an upper surface of the connecting layer being flat or planar, and wherein the adhesive strength in adherence of the Pb-Sn solder to the connecting layer is so large as to allow the Pb-Sn solder to be deformed and sheared without causing any separation at the interface between the Pb-Sn solder and the connecting layer. Since it is not needed to form such a recess as described in Japanese patent provisional publication No. 8-31974, which is difficult to form and further since the upper surface of the connecting layer is planar, it becomes possible to form pads with ease similarly to the conventional method. Furthermore, since the connecting layer and the Pb-Sn solder are adhered to each other with such a strength as not to cause separation at the interface between the connecting layer and the Pb-Sn solder but to cause deformation and shear fracture of the Pb-Sn solder, thus making it possible to attain a high durability.

According to a further aspect of the present invention, there is provided a ceramic substrate having a pad on a surface thereof and a terminal member attached to the pad with Pb-Sn solder, wherein the pad includes a metallic layer formed on the surface of the substrate and a connecting layer made of a nickel base alloy and formed on the metallic layer, and wherein an intervening layer which contains nickel and gold and the percentage gold content of which is higher than the percentage gold content of the Pb-Sn solder is provided between the Pb-Sn solder and the connecting layer. The connecting layer made of a nickel base alloy and the Pb-Sn solder are connected to each other by interposing therebetween the intervening layer, whereby it never occurs that by a shearing force applied to the terminal the connecting layer and the solder is separated at the interface therebetween as in the prior art device. In this instance, due to dissolution of gold, the Pb-Sn solder contains gold by a certain percentage content. However, since there remains in the intervening layer gold that is prevented from being dissolved into the solder by the operation of nickel, the percentage gold content of the intervening layer is higher than that of the solder. Since such an intervening layer contains gold, it is wetted well by solder and is adhered well to the connecting layer made of nickel base alloy. Accordingly, the intervening layer located between the solder and the connecting layer can join the both firmly. Thus, even if shearing stress is applied to the terminal, it never occurs such fracture or breakage as to cause separation between the solder and the connecting layer.

According to a further aspect of the present invention, there is provided a method of producing a ceramic substrate having on a surface thereof a pad to be attached to a terminal member with Pb-Sn solder, comprising the steps of preparing the pad which includes a metallic layer formed on the surface of the substrate and a connecting layer made of a nickel base alloy and formed on the metallic layer by plating, forming a gold layer made of a gold base alloy and of the thickness in the range of 0.01 $\mu$m to 0.5 $\mu$m on the connecting layer by plating, and making nickel in the connecting layer diffuse into the gold layer by heat treatment and thereby form a gold-nickel layer. In this instance, the term "plating", when used by itself, is intended to indicate, throughout the specification and claims, both "electroplating" and "electroless plating". Since nickel of the lower connecting layer is made to diffuse into the gold layer to form the gold-nickel layer and the terminal is soldered with Pb-Sn solder, gold in the gold-nickel layer is not easily dissolved into the solder. That is, nickel restricts disappearance of gold by restricting eating or consumption of gold by solder. Furthermore, since the gold-nickel layer is obtained by heat treatment, it can be attained with ease and the amount of nickel diffusion can be controlled with ease by varying the heat treatment temperature and its processing time. Further, since the plating solutions taken into the plated film or layer can be removed by being gasified at the time of heat treatment, it becomes possible to prevent discoloration and corrosion of the plated layer. In the meantime, it is preferable to set the thickness of the gold layer to be equal to or larger than 0.01 μm for the necessity of preventing oxidation of the nickel layer and to be equal to or smaller than 0.5 μm for the necessity of preventing formation of a too much amount of gold-tin intermetallic compounds.

In this connection, it is preferable that the nickel content of the gold-nickel layer is equal to or larger than 10 atomic %. In case the nickel content is equal to or larger than 10 atomic %, the connecting layer and the solder are least liable to be separated at the interface therebetween when a shearing force is applied to the terminal.

Further, it is preferable to set the maximum heat treatment temperature to be equal to or higher than 150° C. By heat treatment at the temperature of 150° C. or higher, nickel in the nickel layer can be diffused into the gold layer to form the gold-nickel layer.

Further, it is preferable to set the maximum temperature of the heat treatment to be 350° C. or higher. By heat treatment at the temperature equal to or higher than 350° C., the gold-nickel layer can be of such one into which a sufficient amount of nickel is diffused.

Further, it is preferable to form the connecting layer by nickel-boron plating. This is because the nickel-boron plated film or layer has a large content of nickel compound so that it is close to pure nickel and therefore has a high melting point, and it is preferable that soldering with a high strength can be attained in the case pins, etc. are to be soldered in a manufacturing process. Further, the connecting layer formed by nickel-boron plating produces a good wettability relative to solder, so it can be wetted by solder even if it contacts directly with the solder.

According to a further aspect of the present invention, there is provided a method of producing a ceramic substrate having a pad on a surface thereof and a terminal member attached to the pad with Pb-Sn solder, comprising the steps of preparing the pad which includes a metallic layer formed on the surface of the substrate and a connecting layer made of a nickel base alloy and formed on the metallic layer by plating, forming a gold layer made of a gold base alloy and of the thickness in the range of 0.01 μm to 0.5 μm on the connecting layer by plating, making nickel in the connecting layer diffuse into the gold layer by heat treatment and thereby forming a gold-nickel layer, and attaching the terminal member to the gold-nickel layer with Pb-Sn solder.

Since nickel in the connecting layer is made to diffuse into the gold layer to form the gold-nickel layer and soldering of the terminal is performed by the use of the Pb-Sn solder, gold in the gold-nickel layer is not easily dissolved into the solder, i.e., nickel restricts disappearance of gold by restricting eating or consumption of gold by the solder. Furthermore, such processing can be attained with heat treatment and therefore with ease, and the amount of diffusion can be varied with ease depending upon heat treatment temperature and its processing time. In the meantime, it is preferable to set the thickness of the gold layer to be equal to or larger than 0.01 μm for the necessity of preventing oxidation of the nickel layer and to be equal to or smaller than 0.5 μm for the necessity of preventing formation of a too much amount of gold-tin intermetallic compounds.

The above structure and method can solve the above noted problems inherent in the prior art.

It is accordingly an object of the present invention to provide a ceramic substrate having a pad, which can make higher the adhesive strength in adherence of the pad to Pb-Sn solder and enables the pad to be highly durable against a shearing strength.

It is a further object of the present invention to provide a ceramic substrate of the foregoing character which has a terminal attached to the pad.

It is a further object of the present invention to provide a method of producing a ceramic substrate of the foregoing character.

BRIEF DESCRIPTION OF THE DRAWINGS

FIG. 4 is a graph of a relation between a maximum heat treatment temperature and a nickel content in a gold-nickel layer;

FIGS. 7A and 7B are schematic views of illustrating the modes of breakage or fracture occurring in a shearing strength test, in which FIG. 7A shows the pad/solder mode (i.e., mode in which fracture is caused at the interface between pad and solder) and FIG. 7B shows a solder/solder mode (i.e., mode in which fracture is caused by breakage of solder);

DETAILED DESCRIPTION OF THE PREFERRED EMBODIMENT

An embodiment of the present invention will be described hereinafter with reference to the attached drawings.

Figure 1:
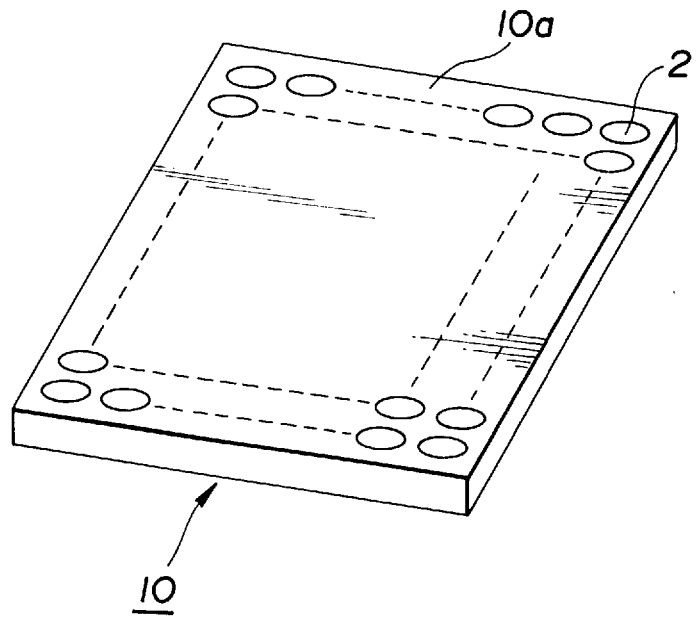
FIG. 1 is a perspective view of an alumina ceramic substrate in which the present invention is to be embodied.
Figure 2:
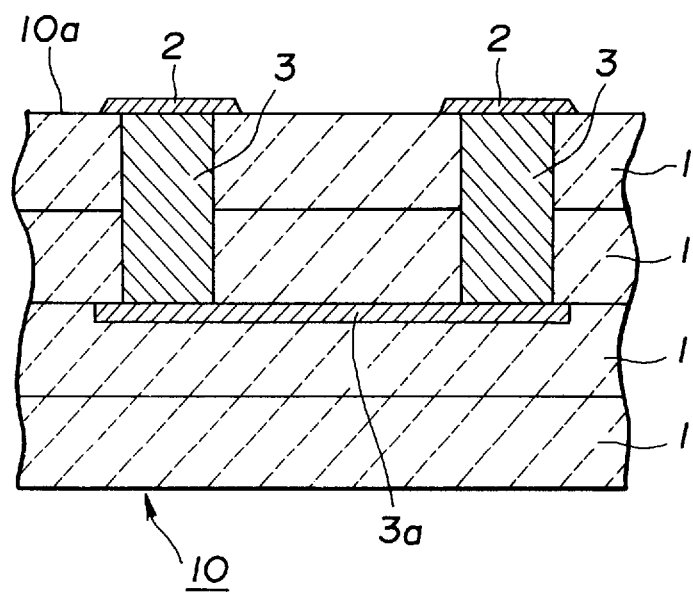
FIG. 2 is an enlarged, fragmentary sectional view of the alumina ceramic substrate of FIG. 1.

As shown in FIGS. 1 and 2, an alumina ceramic substrate 10 is in the form of a plate of being substantially square in external shape when viewed in a plan view. The substrate 10 is 21 mm long at each side and 1.0 mm thick, and consists of four ceramic layers 1. In production, 90 wt. % alumina ceramic powder and 10 wt. % glass frit powder and pigment are mixed together with organic binder and solvent and thereafter applied on a film by means of a doctor blade method and dried to form a ceramic green sheet. Then, the green sheet is cut to a predetermined size and formed with via holes by punching, and thereafter the via holes are filled with metallizing ink whose principal or major component is molybdenum, i.e., molybdenum base metallizing ink. Further, the molybdenum base metallizing ink is printed on the ceramic green sheet and dried to form a wire or conductor and metallic layers for pads. A plurality of such ceramic green sheets are laid one upon another in a predetermined sequence and joined together by compression, and fired in the atmospheres of $H_2$ and $H_2O$ and at the maximum temperature of about 1550° C. to form the substrate 10 after being provisionally fired to remove the binder.

One major surface or side surface (i.e., upper surface in FIG. 1) 10a of the substrate 10 is formed with 256 in total of molybdenum metallized layers (metallic layers) by simultaneous or concurrent firing (i.e. firing for both ceramic substrate and metallized layers), which are arranged lengthwise and widthwise at the pitch of 1.27 mm so as to form a grid pattern having 16 arrays widthwise and lengthwise, respectively and each of which is 0.86 mm in diameter and 20 μm thick.

In this instance, as shown in FIG. 2, adjacent two metallized layers 2 are connected to each other by vias 3 which contact with the respective lower surfaces of the metallized layers 2 and an inner wire or conductor 3a which connects between the vias 3. Such metallized layers 2, when joined to a printed circuit board having a similar structure as will be described hereinafter, constitute a so-called daisy chain structure, and in this embodiment all of the 256 metallizing layers 2 are connected by only one conductor.

Figure 3A:
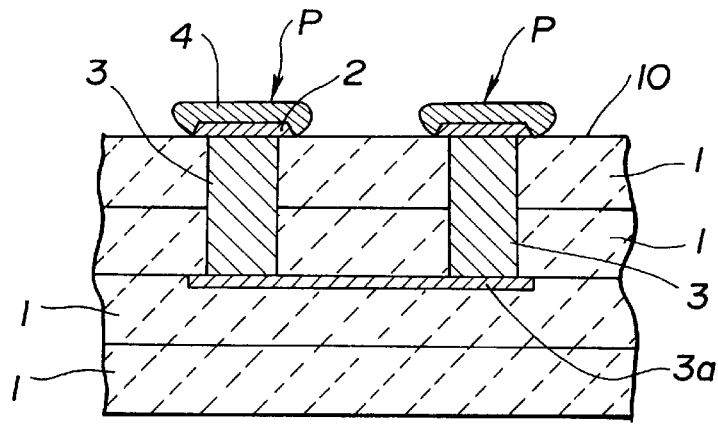
FIGS. 3A to 3C are views similar to FIG. 2 but show processes for forming a connecting layer and a gold-nickel layer on a ceramic substrate according to an embodiment of the present invention.

Then, as shown in FIG. 3A, the ceramic substrate 10 is dipped in palladium chloride liquid and thereafter washed to form a Pd-plated core. The ceramic substrate 10 is then plated with nickel-boron by electroless plating to form a nickel-boron plated layer 4 of 3.4 μm thick for thereby constituting a connecting layer having a flat upper surface, whereby a pad P consisting of the metallized layer 2 and the connecting layer 4 is formed.

Figure 3B:
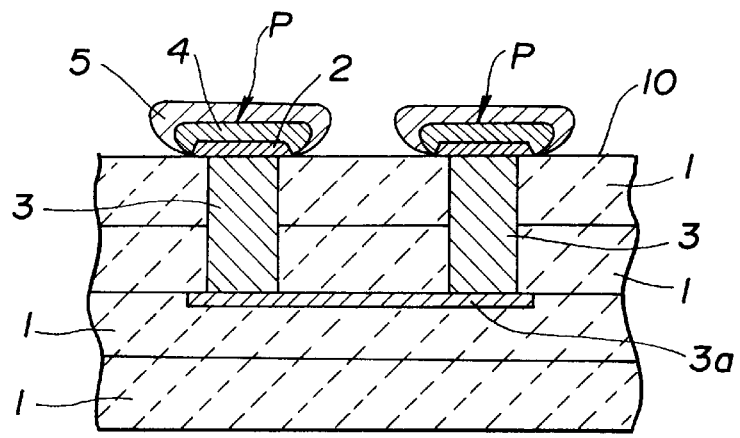

Further, the connecting layer 4 has formed thereon by electroless plating a gold-plated layer of 0.05 μm thick and is thereby formed with a gold layer 5 as shown in FIG. 3B.

Then, a plurality of such ceramic substrates 10 are prepared and charged into continuous furnaces having hydrogen atmospheres of the maximum temperatures of 150° C., 250° C., 350° C., 450° C., 550° C. and 650° C., respectively.

Figure 3C:
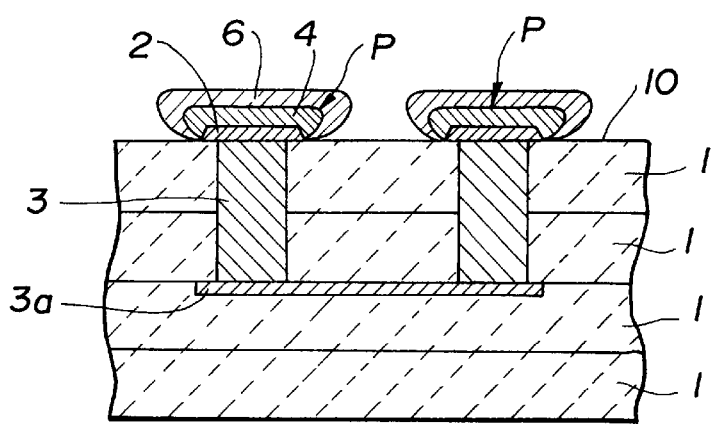

By this heat treatment, nickel in the connecting layer 4 is diffused into the gold layer 5 so that the gold layer 5 is changed into a gold-nickel layer 6 as shown in FIG. 3C. The color tone of the gold-nickel layer 6 changes a little depending upon the heat treatment temperature, and an example processed at or below 250° C. had a gold color that was least different from that before heat treatment. On the other hand, as the heat treatment temperature rises increasingly beyond 350° C., the gold color of the gold-nickel layer 6 becomes more whitish progressively. From the color tone of the nickel-gold layer 6, it is seen that the higher the heat treatment temperature becomes, the more diffusion of nickel occurs.

In the meantime, for the purpose of comparison, comparative examples that are substantially the same as the above described examples except for being not processed by the above described heat treatment, are prepared.

The nickel content in the gold-nickel layer 6 in those examples is measured by means of an Auger electron analyzer. The measurement of the Auger electron analysis is carried out by the use of the Auger electron analyzer of "JAMP 30" and JEOL make and with the condition that the acceleration voltage is 10 kV, the irradiation current is $3 \times 10^{-7}$ mA, and the spot diameter is 50 μm. With those conditions, the information of the substances existing in the extent from the surface to the depth of about 50 angstrom (0.005 μm) of the test example can be obtained. In this connection, the measurement was carried out at three points on the surface of each gold-nickel layer 6 and the average of the measurement values was calculated and determined as a nickel content.

The nickel content measured in the above manner is shown in Table 1. Further, in FIG. 4, the relation between the maximum heat treating temperature and the nickel content is shown.

TABLE 1

| Example No. | Heat Treatment Temp.(°C.) | Ni content (atomic %) | Shearing Strength (kg) Average | Dispersion | Mode of Fracture |
|---|---|---|---|---|---|
| 1 | Not Heat Treated | 0 | 1.46 | 0.16 | 0/10 |
| 2 | 150 | 11 | 1.96 | 0.11 | 6/10 |
| 3 | 250 | 14 | 2.12 | 0.06 | 9/10 |
| 4 | 350 | 18 | 2.09 | 0.07 | 10/10 |
| 5 | 450 | 18 | 2.10 | 0.10 | 10/10 |
| 6 | 550 | 22 | 2.10 | 0.06 | 10/10 |
| 7 | 650 | 24 | 2.10 | 0.14 | 10/10 |

No. 1 is a comparative example. The number of examples used for measurement of each Ni content is three. The number of examples used for measurement of the shearing strength and mode of fracture for each heat treatment temperature are ten (i.e., five substrates each having two terminals).

As will be apparent from Table 1 and the graph of FIG. 4, in the comparative example (example No.1) which is not heat treated, nickel is not contained in the gold layer 5. On the other hand, it is seen that in an example which is heat treated at 150° C. (example No. 2) about 11 atomic % of nickel is contained in the gold-nickel layer 6. Further, it will seen that as the heat treatment temperature rises up to 250° C., 350° C. and 450° C., the content of nickel becomes higher gradually.

Figure 5A:
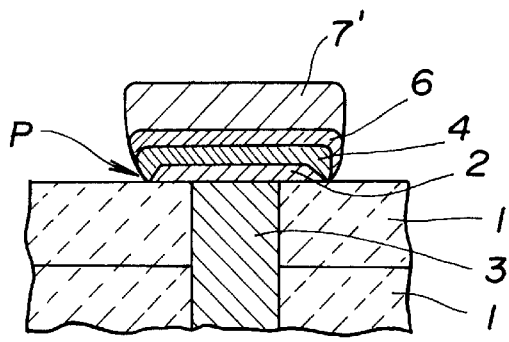
FIGS. 5A to 5C are views similar to FIGS. 3A to 3C but show processes for soldering a terminal member to a ceramic substrate and the resulting soldered states according to another embodiment of the present invention.
Figure 5B:
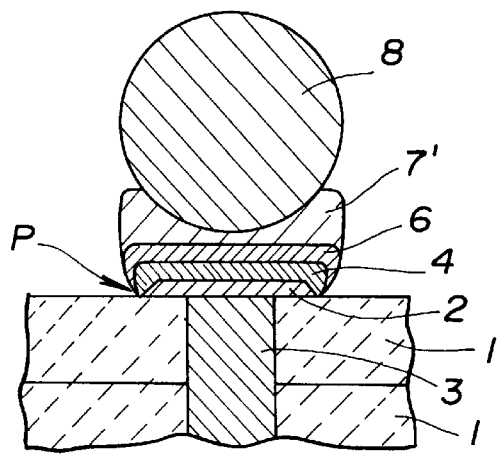
Figure 5C:
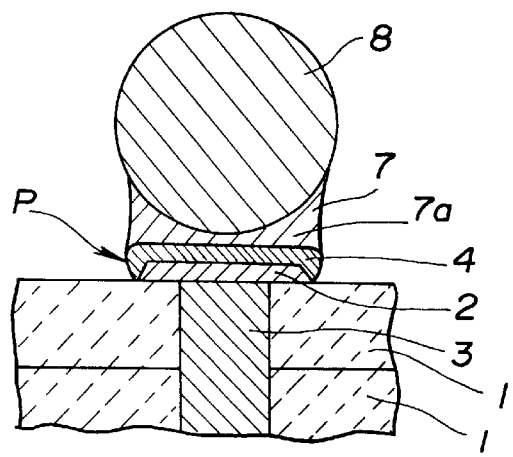

Then, as shown in FIG. 5A, a solder paste 7' of Pb-Sn eutectic solder (Pb63%-Sn37%) is screen printed on the gold-nickel layer 6 of the ceramic substrate 10 in such a manner as to be about 300 μm thick, a spherical terminal member 8 which is 890 μm in diameter and made of high temperature solder (Pb90%-Sn10%) is placed on the solder paste 7' as shown in FIG. 5B, and charged into a reflow furnace. In this manner, the spherical terminal member 8 made of high temperature solder is soldered to the pad P with the Pb-Sn eutectic solder 7 as shown in FIG. 5C.

In the meantime, a terminal member 8 is similarly soldered to the comparative example which is not heat treated, with eutectic solder.

Figure 6:
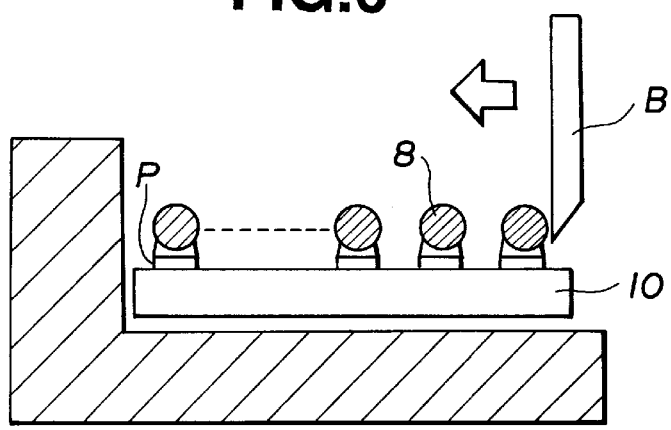
FIG. 6 is a schematic view of a system for measuring a shearing strength.

Then, in order to examine the adhesive strength in adherence of the Pad P to the solder 7 against a shearing stress, a die shearing tester (made by ANZA TECH and of the model of 520D) is used, and after the substrate 10 is fixed as shown in FIG. 6, a shearing blade B is pushed in the direction parallel to the surface of the pad P and against the terminal members 8, whereby examination is made about the strength (shearing strength) which is the force causing breakage or fracture of terminal member, and about the mode of fracture. Five substrates each having two terminals, i.e., ten terminals are used for measurement of the shearing strength for each example of each heat treatment temperature. The result of the measurement is described in the column of the shearing strength and the column of the mode of fracture of Table 1.

In the meantime, the mode of fracture in Table 1 is represented by the number of examples which was fractured in a solder/solder mode which will be described hereinafter, relative to the number of total examples.

As will be apparent from the result shown in Table 1, when comparison of the examples is made with respect to the shearing strength in average, the comparative example is 1.46 Kg in shearing strength, whereas either of the examples whose nickel content is equal to or higher than 10 atomic % is about 2 Kg in shearing strength, so improvement in the shearing strength is acknowledged. Furthermore, it will be seen that in case of the comparative example the variation (dispersion or scattering) of the measured values is large, so the shearing strength and therefore the adhesive strength in adherence of the pad P to the solder 7 is unstable. In contrast to this, in case of the heat treated examples the variation is relatively small, so it will be seen from this that the adherence of the both is stable.

Figure 7A:
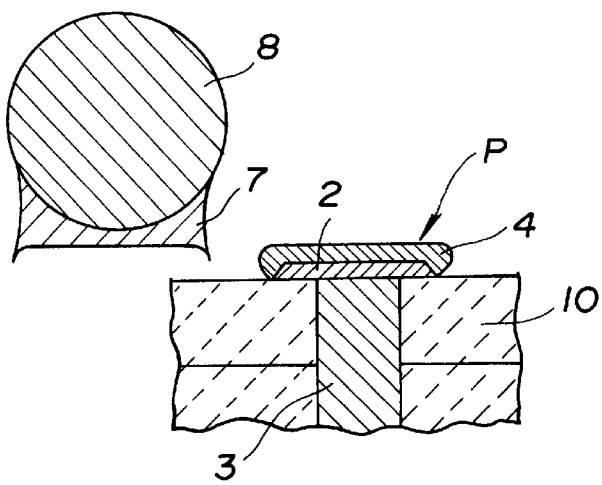
Figure 7B:
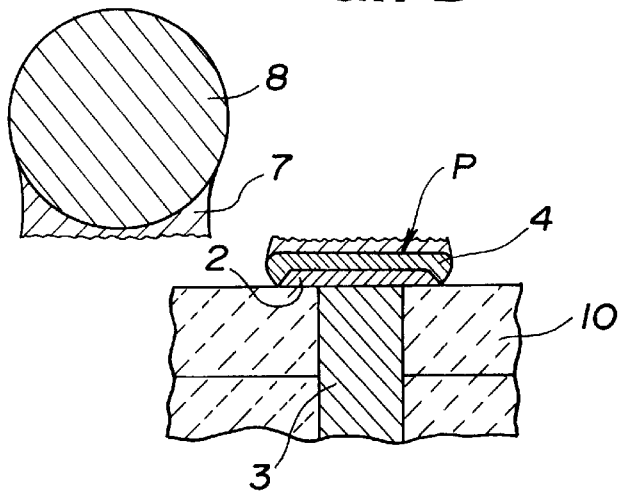

Furthermore, a large difference in the mode of fracture is acknowledged between the comparative example and the heat treated example. That is, in case of the comparative example, all of the ten measured examples were fractured in such a manner that the pad P and the solder 7 were separated from each other at the interface therebetween, i.e., in the pad/solder mode as shown in FIG. 7A. On the other hand, six out of ten examples in the case the examples were heat treated at 150° C., nine out of ten examples in the case the examples were heat treated at 250° C., and all of ten examples in the case the examples were heat treated at 350° C. or more and the nickel content thereof was 15 atomic % or more, were broken in the solder/solder mode as shown in FIG. 7B.

This shows that the adhesive strength in adherence of the pad P to the solder 7 is larger than the shearing strength of the solder 7 of itself (i.e., about 2 Kg). That is to say, it is considered that the shearing strength of the solder 7 of itself is lower than that of the shearing strength at the joint between the pad P and the solder 7, so the smaller shearing strength of the solder 7 of itself is measured and actually the pad P and the solder 7 are adhered at the strength sufficiently larger than the shearing strength of the solder 7 of itself (about 2 Kg), though the difference in the shearing strength relative to the comparative example is only 0.5 Kg or so. In other words, it is shown that in the case the gold-nickel layer 6 is formed on the pad P having the nickel-boron connecting layer 4 on the surface thereof, 0.5 Kg or so can be increased even in an apparent adhesive strength and actually more.

The reason why such a difference is caused is considered as follows. In the case only the gold layer 5 is formed on the connecting layer 4 by plating or the like, e.g., in the case of the comparative example in the above described test, gold is diffused into the eutectic solder quite easily to cause eating or consumption by solder. In the case the thickness of gold is thin as in this example, the connecting layer 4 serving as a base metal is exposed as soon as gold is diffused into the solder, so soldering occurs between the connecting layer 4 and the eutectic solder 7. The nickel-boron plated layer used for the connecting layer 4 has a good soldering ability among plated layers whose major or principal component is nickel, i.e., nickel base alloy-plated layers, but nickel of itself does not have a good soldering ability. Nickel is stable and relatively not easily diffused into the solder. Accordingly, though the connecting layer 4 is wetted by the solder 7 and soldering thereof occurs, it cannot be said that the adhesive strength thereof is sufficient. Accordingly, as mentioned above, it is considered that in the shearing strength test the adherence is broken or fractured in such a manner as to cause the pad P (i.e., the connecting layer 4) and the solder 7 to be separated from each other at the interface therebetween.

On the other hand, in the gold-nickel layer 6 to which the gold layer 5 is changed by diffusing nickel thereinto by heat treatment, gold which is easily eaten or consumed by (i.e., easily diffused into) solder is mixed with nickel which is not easily eaten or consumed by (i.e., not easily diffused into) solder.

Thus, in the case the terminal member 8 is soldered to the gold-nickel layer 6 with the eutectic solder 7, it is obtained such a condition in which gold is more hard to diffuse into the solder 7 as compared with that in the gold layer 6. This is because nickel in the gold-nickel layer 6 restricts diffusion of gold into the solder. Accordingly, gold in the gold-nickel layer 6 is not all diffused into the solder 7 but remained with nickel and serves as a quite thin intervening layer 7a for preventing the solder 7 from directly contacting the connecting layer 4. In this connection, since a boundary between the intervening layer 7a and the solder 7 is not clearly provided, it is not shown in the drawing. The intervening layer 7a is firmly adhered to the solder 7 since gold contained in the intervening layer 7a is wetted well by the solder 7, whereas nickel contained in the intervening layer 7a and nickel contained in the connecting layer 4 are adhered well. In this manner, the connecting layer 4 and the solder 7 are joined firmly by way of the intervening layer 7a. Accordingly, when the shearing strength test was carried out, fracture was not caused at the joint between the connecting layer 4 and the solder 7 but fracture of the solder 7 of itself which was low in the shearing strength, was caused.

Further, it is considered that gold in the gold-nickel layer 6 is not easily diffused into the eutectic solder 7 and thus it is hard to occur that diffused gold reacts with tin contained in the solder 7 to form brittle intermetallic compounds.

Further, in order to acknowledge the reliability on the adherence of the pad P (connecting layer 4) to the solder 7, the above described examples and comparative examples are connected to a printed circuit board PCB made of glass epoxy having the coefficient of thermal expansion of $20 \times 10^{-6}$/°C. and subjected to the test for evaluating the durability against repeated application of the shearing stress. The printed circuit board PCB is 1.6 mm thick and has on one main surface PCBa thereof pads C which are disposed at the positions corresponding to and at the same pitch as the pads P of the above described examples. The pads C are made of copper (Cu) and is sized to be 0.72 mm in diameter and 45 μm thick, and its surface is coated with eutectic solder.

Figure 8:
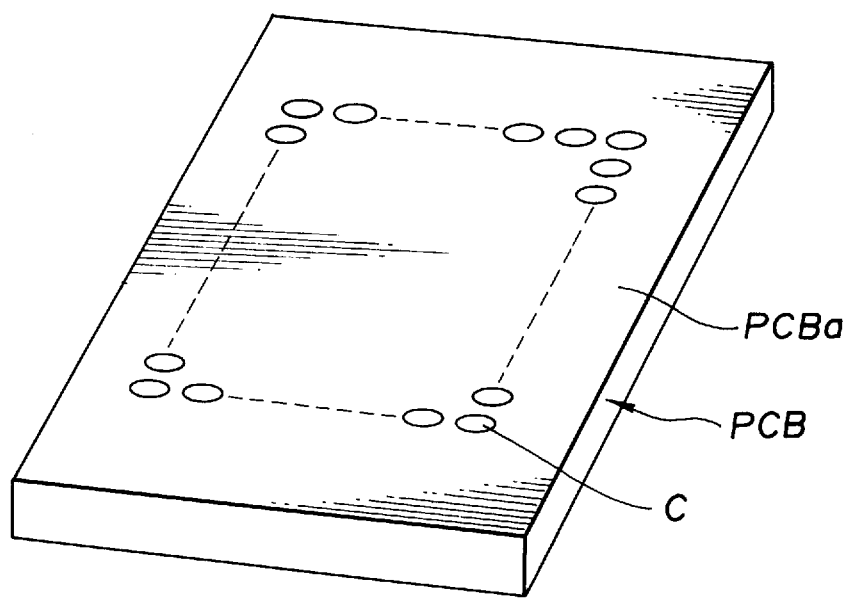
FIG. 8A is a perspective view of a printed circuit board for connection with a ceramic substrate.
FIG. 8B is an enlarged, fragmentary sectional view of the printed circuit board of FIG. 8A.
Figure 8:
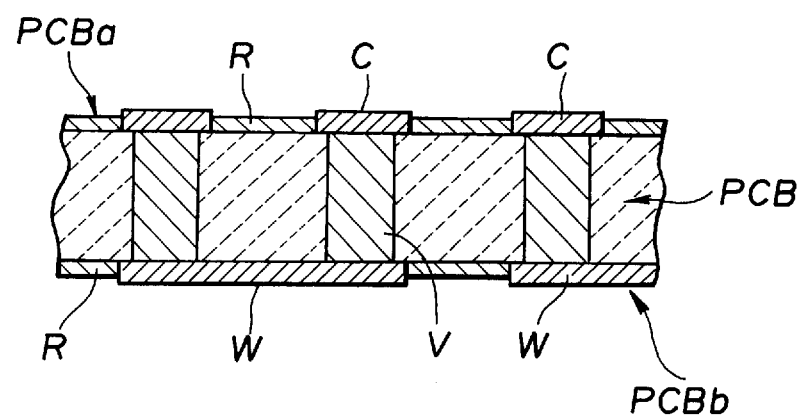

Further, as shown in FIG. 8B, the printed circuit board PCB has just under the respective pads C vias V extending vertically through the printed circuit board PCB and at the other main surface PCBb connecting conductors W each connecting between adjacent two vias V. The conductors W, etc. of the printed circuit board PCB are constructed and arranged so as to constitute, as described above, a daisy chain structure when connected to the substrate 10, i.e., all of the 256 joining portions are included in one conductor. This is for the purpose of allowing the wiring of a daisy chain structure to burn out in the case even one of the terminals connecting between the ceramic substrate 10 and the printed circuit board PCB is burnt out and thereby making judgment on a defect with ease. In the meantime, the printed circuit board PCB has on the surfaces PCBa and PCBb thereof and at predetermined positions between the pads C and between the connecting conductors W solder resist for improving the moisture resistance and the soldering ability.

Figure 9:
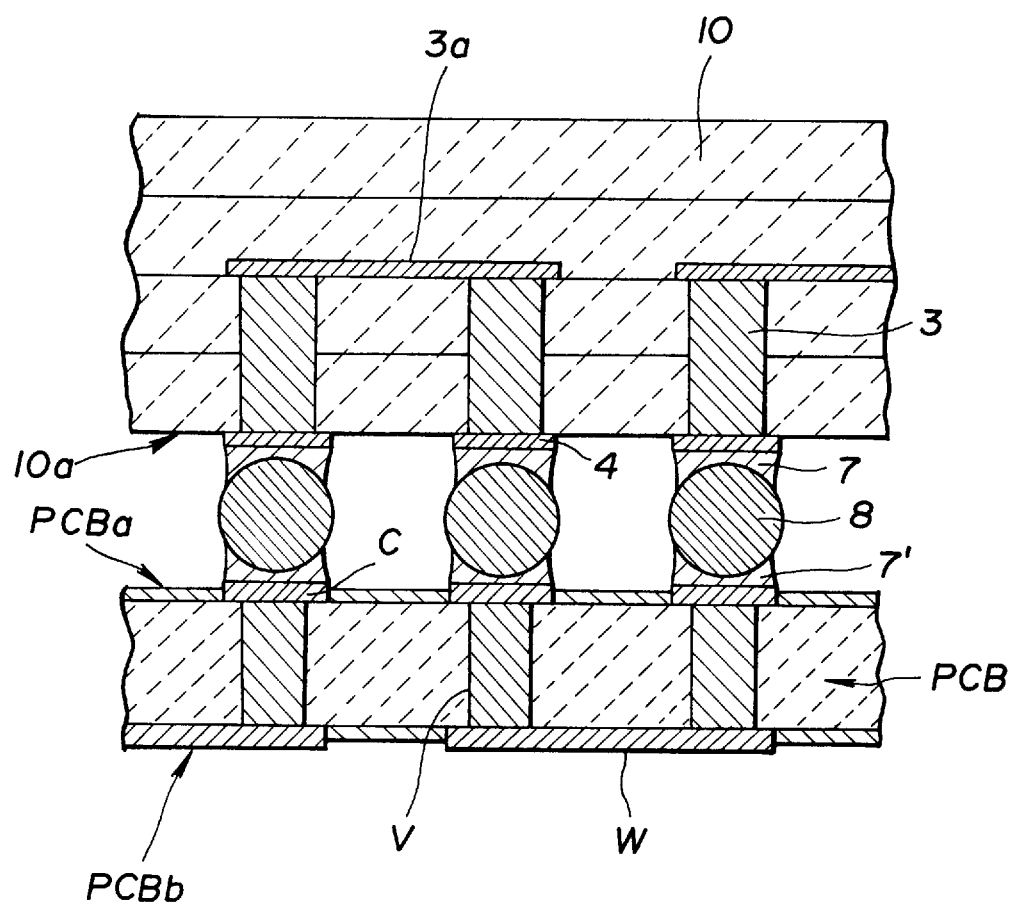
FIG. 9 is a view similar to FIG. 8B but shows the printed circuit board in a condition of being joined with a ceramic substrate.

The connection of the printed circuit board PCB with the test examples and the like is made by applying Pb-Sn eutectic solder paste on the pads C in such a manner that the applied solder paste is 300 μm thick, positioning so that the terminal members 8 provided to the examples and the like are placed at the center of the respective pads C, and thereafter charging them into the reflow furnace heated up to 215° C. for thereby making the solder paste melt and solder the pads C and the terminal members 8 with solder 7'. In the above manner, an assembly of the printed circuit board PCB and the ceramic substrates 10, having such a sectional structure as shown in FIG. 9, is prepared.

The examples and the like connected with the printed circuit board PCB are placed in a constant temperature vessel and subjected to a heat cycle (cooling and heating cycle) test under a condition that the temperature varies from −40° C. to 125° C. and the cycle time is 60 minutes so that a shearing force is applied to the joining portion (i.e., the terminal members 8, etc.), and it is examined whether fracture is caused at the joining portion. Whether fracture is caused at the joining portion or not is acknowledged by examining whether the conductor of the above described daisy chain structure is conducting between the opposite ends thereof. The heat cycle test was carried out with respect to the substrate 10 which was heat treated at 450° C. and the comparative example which was not heat treated, and by connecting ten substrates 10 and ten comparative examples to the printed circuit board PCB, respectively.

In Table 2, the number of the test cycles at which fracture (burning out) was caused in each example is shown.

TABLE 2

| Heat Treatment Temp. | Number of Test Cycles Until Occurrence of Burning Out | | | | | | | | | |
|---|---|---|---|---|---|---|---|---|---|---|
| 450° C. | 691 | 708 | 743 | 789 | 808 | 812 | 826 | 916 | 956 | 982 |
| Not Heat Treated | 154 | 155 | 167 | 201 | 229 | 257 | 386 | 416 | 509 | 514 |

From Table 2, the difference between the comparative example and the heat treated example will be apparent.

That is, in the case the comparative example is connected to the printed circuit board PCB, fracture (burning out) of the examples began to occur at 154 cycles, i.e., fracture of the joining portion began to appear in some of the examples, and all of the examples were fractured or burned out at 514 cycles. From the result, calculation of MTTF (average malfunction life) was made and the MTTF of the comparative example which were not heat treated, was 304 cycles.

On the other hand, in the case of the examples which employs the substrate heat treated at 450° C., burning out began to appear at 691 cycles and all of the examples were burnt out at 982 cycles. The MTTF in this case was calculated to be 820 cycles.

Accordingly, from the comparison with the MTTF, it will be seen that the life is elongated about 2.7 times. That is, It will be seen that in the case a terminal is soldered on a gold-nickel layer with Pb-Sn solder a heat treated example can attain a higher reliability as compared with an example which is not heat treated. That is, by diffusing nickel into a gold layer 5 by heat treatment and thereby changing the gold layer 5 to a gold-nickel layer 6, a high adhesive strength can be attained in case of soldering of the terminal member 8 with Pb-Sn alloy solder 7 and furthermore a high reliability in connection can be obtained.

In the meantime, while in the above described embodiment the substrate 10 is heated in its entirety for causing nickel in the connecting layer 4 to diffuse into the gold layer 5 and thereby forming the gold-nickel layer 6, this is not for the purpose of limitation but only the pad P may be heated by irradiation of light or electron beam to cause nickel to diffuse into the gold layer 5. This is desirable since in such a case nickel does not diffuse into the portion of the gold layer 5 to which nothing is soldered and the oxidation resistance of that portion is maintained high.

In the above described embodiment, it has been described and shown that the gold layer 5 is formed by electroless plating and thereafter nickel is diffused into the gold layer 5 to form the gold-nickel layer 6. However, the method of forming the gold-nickel layer is not limited to it, but the gold-nickel layer 6 can be formed by, for example, depositing gold and nickel simultaneously on the pad P by vapor-phase epitaxy such as vapor deposition, spattering, or the like.

Further, while it has been described and shown that a spherical high temperature solder is used as the terminal member 8, this is not for the purpose of limitation but a Cu ball or the like can be used therefor and furthermore its shape is not limited to a spherical shape.

Further, while it has been described and shown that Pb-Sn eutectic solder is used as Pb-Sn al solder, the solder is not limited to eutectic solder. That is, the solder can be Pb-Sn solder of the kind having been controlled in composition so as to have a higher or lower melting point, though needs be determined depending upon the material of the terminal member and the melting point thereof, and can contain other components such as Bi, In, Ag, etc.

Further, the material of the ceramic substrate 10 is not limited to alumina ceramic described and shown in the above described embodiment and any other particular one but can be AlN, mullite, glass ceramic or the like that can be used as a ceramic substrate.

Further, while it has been described and shown that a metallized layer of molybdenum is used for forming the metallic layer 2, the metallic layer can otherwise be formed by printing a thick-film of a high melting point metal such as tungsten, molybdenum-manganese, etc. and firing it concurrent with or after the firing of the substrate. Further, it is possible to form a metallic layer on the surface of the substrate by a thin-film forming technique or by a thin-film forming technique and a plating technique, e.g., such a case may be given in which three layers of Ti-Mo-Cu are formed by spattering and thereafter Cu-plated by electroless plating.

Further, while the connecting layer 4 has been described and shown as being formed by nickel-boron (Ni-B) plating, this is not for the purpose of limitation but it can be formed by Ni-alloy plating such as nickel-phosphor (Ni-P) plating, pure nickel plating, or the like. However, it is desirable to use nickel-boron plating from the point of view of wettability.

From the foregoing, it will be understood that in case a gold-nickel layer is formed on a connecting layer of a nickel base alloy (i.e., an alloy whose major or principal component is nickel) the adhesive strength in adherence of the connecting layer to the Pb-Sn solder is made to become higher, thus improving the shearing strength and the reliability in adherence considerably. Accordingly, in case the present invention is applied to a connecting pad of a substrate that is called LGA or BGA, the pad and the solder in a grid-patterned connection with a motherboard substrate, etc. are adhered firmly, thus making it possible to attain a highly reliable connection. Further, similarly in case an IC chip and a substrate are connected by a flip-chip method, application of the present invention enables the pad and the solder to be adhered firmly and attain a highly reliable connection.

What is claimed is:

1. A ceramic substrate having on a surface thereof a pad to be attached to a terminal member with Pb-Sn solder, wherein said pad includes a metallic layer formed on the surface of the substrate and a connecting layer formed on said metallic layer and made of a nickel base alloy, and wherein a gold-nickel layer made of a gold base alloy containing nickel and of the thickness in the range of 0.01 $\mu$m to 0.5 $\mu$m is formed directly on said connecting layer.

2. A ceramic substrate according to claim 1, wherein the content of said nickel contained in said gold-nickel layer is equal to or higher than 10 atomic %.

3. A ceramic substrate according to claim 1, wherein the content of said nickel contained in said gold-nickel layer is equal to or higher than 15 atomic %.

4. A ceramic substrate as claimed in claim 1, wherein said nickel contained in said gold-nickel layer is the result of diffusion of nickel of said connecting layer when the substrate is heat treated at a predetermined temperature.

5. A ceramic substrate as claimed in claim 1, wherein said nickel contained in said gold-nickel layer is the result of nickel diffusing from said connecting layer when a gold layer formed directly on said connecting layer is heat treated.

6. A ceramic substrate having a pad on a surface thereof and a terminal member attached to the pad with Pb-Sn solder, wherein said pad includes a metallic layer formed on the surface of the substrate and a connecting layer made of nickel base alloy and formed on said metallic layer, an upper surface of said connecting layer being flat, and wherein an intervening layer is provided between said solder and said connecting layer, said intervening layer enabling adherence of said Pb-Sn solder to said connecting layer with such a large adhesive strength that it does not cause any separation at the interface between said Pb-Sn solder and said connecting layer but said Pb-Sn solder is deformed and sheared when force is applied to attempt to separate said solder and said connecting layer from each other.

7. A ceramic substrate having a pad on a surface thereof and a terminal member attached to the pad with solder made of a Pb-Sn alloy containing gold, wherein said pad includes a metallic layer formed on the surface of the substrate and a connecting layer made of a nickel base alloy and formed on said metallic layer, and wherein an intervening layer which contains nickel and gold is provided between said solder and said connecting layer, and wherein the percentage of gold of said intervening layer is higher than the percentage of gold of said solder.

8. A method of producing a ceramic substrate having on a surface thereof a pad to be attached to a terminal member with Pb-Sn solder, comprising the steps of:

preparing the pad which includes a metallic layer formed on the surface of the substrate and a connecting layer made of a nickel base alloy and formed on said metallic layer by plating;

forming a gold layer made of a gold base alloy and of the thickness in the range of 0.01 $\mu$m to 0.5 $\mu$m on said connecting layer by plating; and making nickel in said connecting layer diffuse into said gold layer by heat treatment and thereby form a gold-nickel layer.

9. The method according to claim 8, wherein said heat treatment is of such a kind as to cause the content of nickel in said gold-nickel layer to be equal to or higher than 10 atomic %.

10. The method according to claim 8, wherein a maximum temperature of said heat treatment is equal to or higher than 150° C.

11. The method according to claim 8, wherein a maximum temperature of said heat treatment is equal to or higher than 350° C.

12. The method according to claim 8, wherein said connecting layer is formed by nickel-boron plating.

13. A method of producing a ceramic substrate having a pad on a surface thereof and a terminal member attached to the pad with Pb-Sn solder, comprising the steps of:

preparing the pad which includes a metallic layer formed on the surface of the substrate and a connecting layer made of a nickel base alloy and formed on said metallic layer by plating;

forming a gold layer made of a gold base alloy and of the thickness in the range of 0.01 $\mu$m to 0.5 $\mu$m on said connecting layer by plating;

making nickel in said connecting layer diffuse into said gold layer by heat treatment and thereby forming a gold-nickel layer; and joining the terminal member to the gold-nickel layer by Pb-Sn solder.

* * * * *